United States Patent [19]
Krause

[11] 3,870,976
[45] Mar. 11, 1975

[54] INTEGRATED ATTENUATION ELEMENT COMPRISING SEMICONDUCTOR BODY

[75] Inventor: Gerhard Krause, Ebersberg, Germany

[73] Assignee: Siemens Aktiengesellschaft, Berlin & Munich, Germany

[22] Filed: Jan. 4, 1973

[21] Appl. No.: 321,031

[30] Foreign Application Priority Data
Jan. 24, 1972 Germany........................... 2203209

[52] U.S. Cl.............................. 333/81 R, 333/81 A
[51] Int. Cl........................... H01p 1/22, H03h 7/24
[58] Field of Search...... 333/7 D, 81 R, 81 A, 84 R, 333/84 M; 307/237, 299; 317/235 Y

[56] References Cited

UNITED STATES PATENTS

| | | | |
|---|---|---|---|
| 3,070,711 | 12/1962 | Marcus et al. | 307/299 X |
| 3,246,214 | 4/1966 | Hugle | 317/235 X |
| 3,432,778 | 3/1969 | Ertel | 333/81 R |
| 3,579,059 | 5/1971 | Widlar | 307/299 X |

*Primary Examiner*—Paul L. Gensler
*Attorney, Agent, or Firm*—Hill, Gross, Simpson, Van Santen, Steadman, Chiara & Simpson

[57] ABSTRACT

An integrated attenuation element having a variable attenuation characteristic for high frequency signals comprises a semiconductor body of one conductivity type in one face of which there are arranged two zones of the other conductivity type. The semiconductor body has a contact electrode on the face opposite to that containing the two zones. One of the two zones serves as an input or as an output and the contact electrode serves as an output or as an input, respectively, for the high frequency signals, and the other of the two zones serves as a control zone. In a controllable attenuation circuit means are provided for applying a first control signal between the input and output of the attenuation element, the output being decoupled from ground with respect to high frequencies. The amplitude of the first signal is variable in such a manner that for minimum attenuation it possesses a value at which the p-n junction defining the input zone in the semiconductor body is biased in the forward direction, and to provide increased attenuation the first signal falls to a limiting value at which the p-n junction does not conduct. Means are also provided for applying a second control signal between the control zone, which is connected to ground for high frequencies, and the output. The amplitude of the second control signal is variable in such a manner that for minimum attenuation it possesses a value at which the p-n junction defining the control zone in the semiconductor body does not conduct current, and to provide increased attenuation up to a maximum amount, the signal increases with a polarity such that the p-n junction continuously conducts current to an increasing extent.

12 Claims, 5 Drawing Figures

INTEGRATED ATTENUATION ELEMENT COMPRISING SEMICONDUCTOR BODY

CROSS REFERENCE TO RELATED APPLICATION

This application is related to my pending application, Ser. No. 321,032, filed on even date herewith.

BACKGROUND OF THE INVENTION

1. Field of the Invention

The present invention relates to integrated attenuation elements with a variable attenuation characteristic for high frequency signals, and to a circuit arrangement for the operation of such attenuation elements. 2. Description of the Prior Art If broadcasting and television receivers are operated in the vicinity of powerful transmitters, input voltages of the order of magnitude of 1V can occur. Strong signals of this kind cannot be processed without distortion by the control transistors in the input circuit in the receiver, so that cross-modulation and modulation distortions occur.

It is known in order to improve the strong signal properties of receivers, to use transistors with a relatively high collector current (of the order of magnitude of 10 mA) and a substantially linear characteristic in the input circuit in place of control transistors. In fact, transistors of this kind can be used with input voltages which are approximately one power of ten greater than the permissible voltage for control transistors. However, transistors of this kind are no longer adjustable.

It is also known to use a network of PIN diodes, preferably arranged before the first transistor in the receiver for the same purpose. PIN diodes is the term commonly used for diodes which possess an intrinsic zone (denoted by I) between its p-conducting and n-conducting zones. Previously known PIN diode networks have been relatively expensive. In order to be capable of producing the necessary attenuation, such networks generally consist of three discrete diodes. If a network of this kind is to be integrated using the monolithically integrated technique, each diode must be arranged in an isolated island. Since, however, a PIN diode consists of very thick (approximately 100 $\mu$) and very highly ohmic (> 1,000 ohm cm) material, very deep isolating diffusion operations must be carried out to produce these isolated islands. Diffusion processes of this kind, however, reduce the carrier life time in the semiconductor body to an impermissible extent, owing to the long period of heating required. Furthermore, the behavior for signals having large amplitudes of the PIN diodes is also impaired. Due to undesired lateral diffusion, moreover, the total area required becomes very large. Finally, the large capacitive load due to the capacity of the isolating p-n junctions and the relatively high series impedance of the diodes are also disadvantageous.

SUMMARY OF THE INVENTION

It is an object of the present invention to provide an integrated attenuation element with a variable attenuation characteristic, in particular for the purpose referred to above, in which the disadvantages of the known arrangements at least to a large extent are avoided.

According to the invention, there is provided an integrated attenuation element with a variable attenuation characteristic for high frequency signals comprising a semiconductor body of one conductivity type in one face of which there are arranged two zones of the other conductivity type. The semiconductor body has a contact electrode on the face opposite to that containing the two zones. One of the two zones serves as an input or output and the contact electrode serves as an output or input respectively, for the high frequency signals, and the other of the two zones serves as a control zone.

In accordance with a further aspect of the invention, a controllable attenuation circuit arrangement comprises such an attenuation element, means for applying a first control signal between the input and the output of the element which output is decoupled to earth for high frequencies, the amplitude of the first signal being variable in such manner that for minimal attenuation it possesses a value at which the p-n junction defining the input zone in the semiconductor body is biased in the pass direction and to give increased attenuation, the first signal falls to a limiting value at which the p-n junction conducts no current to give maximum attenuation, and means for applying a second signal between the control zone, which is connected to ground for high frequencies, and the output, the amplitude of which second signal is variable in such a manner that for minimal attenuation it possesses a value at which the p-n junction defining the control zone in the semiconductor body conducts no current, and to give increased attenuation up to a maximum attenuation, it increases with a polarity such that the p-n junction continuously conducts current to an increasing extent.

BRIEF DESCRIPTION OF THE DRAWING

Other objects, features and advantages of the invention, its organization, construction and operation will be best understood from the following description taken in conjunction with the accompanying drawings, on which.

DESCRIPTION OF THE PREFERRED EMBODIMENTS

Figures 1, 2, 3, 4, 5:
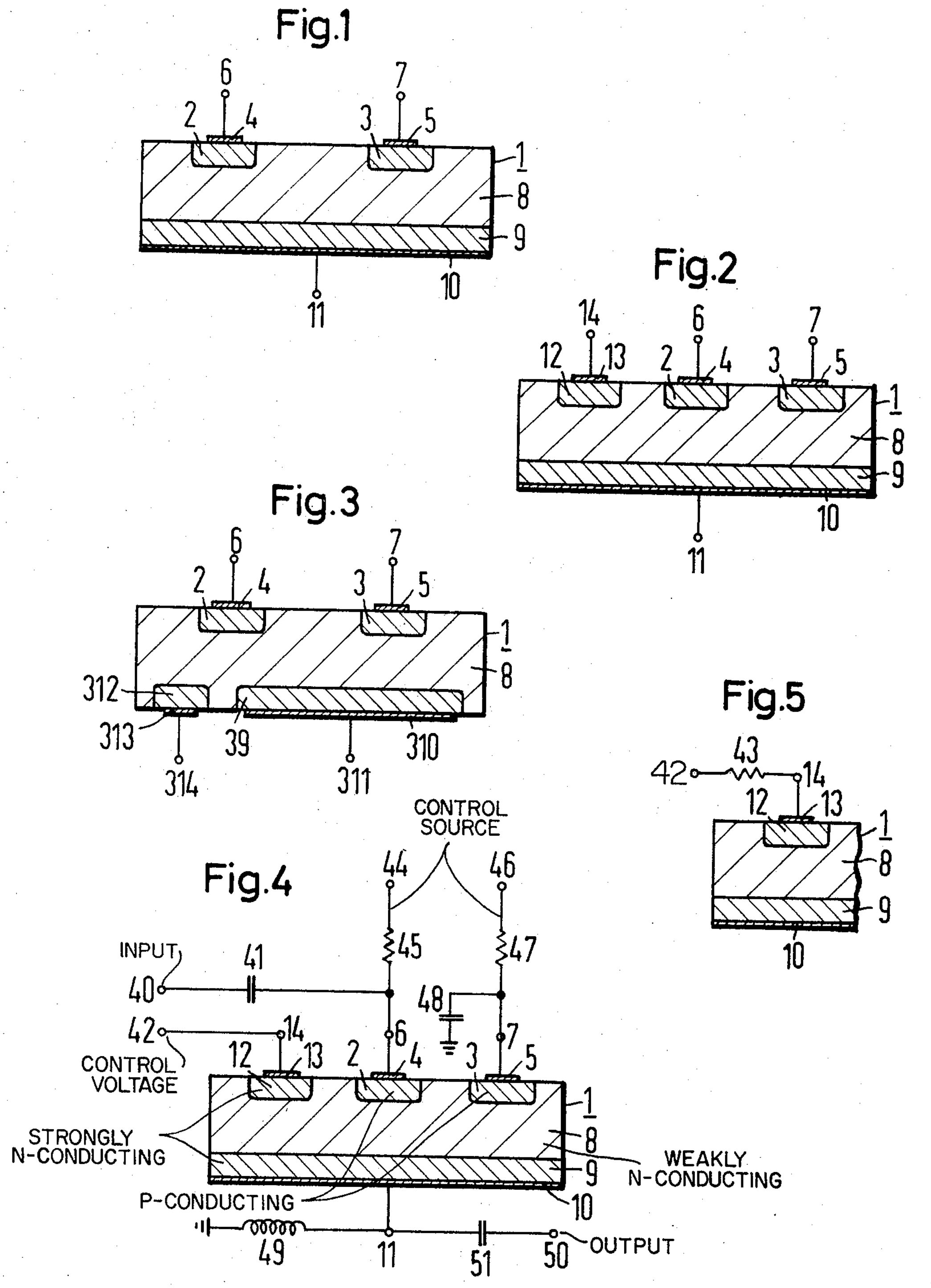
FIG. 1 is a schematic side sectional view of a first form of integrated attenuation element in accordance with the invention.
FIG. 2 is a similar view to that of FIG. 1 of a second form of integrated attenuation element in accordance with the invention.
FIG. 3 is a similar view to that of FIG. 1 of a third form of integrated attenuation element in accordance with the invention.
FIG. 4 is a schematic side sectional view of the embodiment of FIG. 2 connected for operation in a circuit arrangement.
FIG. 5 shows a modified form of a part of the circuit arrangement of FIG. 4.

In the embodiment illustrated in FIG. 1, in one face of a semiconductor body 1 which may, for example, be a weakly n-conducting silicon monocrystal doped with phosphorus at a concentration of approximately $10^{12}cm^{-3}$, there are arranged two highly doped p-conducting zones 2 and 3 which may be produced, for example, by boron diffusion with a concentration of approximately $5 \times 10^{20}cm^{-3}$. On the opposite face of the semiconductor body 1 there is provided a strongly doped, n-conducting zone 9, extending over the entire face of the semiconductor body 1, and which may be produced, for example, by a phosphorous diffusion with a concentration of approximately $3 \times 10^{20}cm^{-3}$. With this configuration, a weakly conducting zone 8 of the original starting semiconductor body 1 remains between the zones 2, 3 and 9.

The zones 2 and 3 are each provided with a contact electrode 4 and 5 respectively, which are in turn provided with terminals 6 and 7 respectively. In this embodiment, the entire surface area of the zone 9 is similarly provided with a contact electrode 10, which is connected to a terminal 11.

Preferably, the zones 2 and 3 are arrangned aligned in a row with respect to one another.

In the embodiment of the invention which is illustrated in FIG. 2, in the neighborhood of the input zone 2, there is provided an electrode which is formed by a zone 12 with a contact 13 connected to a terminal 14. This zone 12 which is preferably, but not necessarily, strongly n-conducting, can be produced for example, by phosphorus diffusion with a concentration of $3 \times 10^{20}cm^{-3}$. In other respects, this embodiment corresponds to that of FIG. 1, identical parts being provided with the same reference numeral in the two figures.

The further zone 12 is not absolutely necessary in this embodiment; when the zone 12 is not present, merely the contact 13 is provided at this point.

In the embodiment shown in FIG. 3, a zone 312 which corresponds to the zone 12 in the embodiment shown in FIG. 2 is provided in the neighborhood of the input zone 2 but at the other face of the semiconductor body 1. This zone 312 is provided with a contact 313 and is connected to a terminal 314. In this embodiment, a zone 39, which corresponds to the zone 9 shown in FIG. 1 and 2 occupies merely a part of the face of the semiconductor body 1 remote from the zones 2 and 3. The contact electrode 310 provided for this zone and which is connected to a terminal 311, therefore also possesses corresponding dimensions.

In this embodiment also, the zone 312 is not absolutely necessary; when the zone 312 is not present, merely the contact 313 is provided at this point.

FIG. 4 shows a controllable attenuation circuit arrangement comprising an attenuation element in accordance with the invention as shown in FIG. 2. This circuit operates as follows.

A high frequency signal which is to be attenuated, is applied to an input terminal 40 and is fed through a coupling capacitance 41 to the input zone 2. The input zone 2 is also connected through a resistor 45 and a terminal 44 to a control signal source which itself is connected to the terminal 44 and to ground. Correspondingly, the control zone 3 is connected through a resistor 47 and a terminal 46 to a control signal source which is connected to the terminal 46 and to ground. The attenuated output signal is withdrawn at an output terminal 50 connected to the terminal 11 through a coupling capacitance 51. The electrode 10 (and correspondingly the electrode 310 when the embodiment shown in FIG. 3 is used) is connected to earth via a choke 49 which blocks the signal frequency.

If the control voltage applied to the terminal 44, which can be a d.c. voltage or an a.c. voltage with very low frequency relative to the signal frequency, is positive relative to ground, then the p-n junction formed between the input zone 2 and the region 8 of the semiconductor body 1 is biased in the pass direction, in view of the above-stated conductivity types of these zones. Holes therefore diffuse from the zone 2 across the p-n junction into the region 8. Similarly, electrons diffuse from the highly doped zone 9 into the region 8. As this region is weakly doped relative to the zones 2, 3 and 9, the density of the movable charge carriers diffusing from these zones is very much greater than the density of the doping atoms in the region 8. Therefore, the differential resistance between the zones 2 and 8 is lower by several powers of ten than it would be if there were no control signal applied to the terminal 44.

If a zero or negative voltage is simultaneously connected to the terminal 46, then the p-n junction formed between the control zone 3 and the region 8 is blocked so that no current flows across this junction.

In this state, the input signal applied to the input 40 can flow through the input zone 2 and the zone 8 to the output 50 without any appreciable attenuation (e.g., less than 1dB).

If, on the other hand, a zero voltage or a negative voltage relative to ground, is applied to the terminal 44, then the p-n junction between the input zone 2 and the region 8 is blocked. If, a positive control voltage relative to ground is simultaneously applied to the terminal 46, then the p-n junction between the control zone 3 and the region 8 is biased in the pass direction.

Holes are therefore injected from the zone 3 into the zone 8, and electrons are injected from the zone 9 into the zone 8 so that the differential resistance of the path between the control zone 3 and the zone 9 becomes very low (for example, approximately 5 ohms with a control current of 10mA). As the p-n junction between the input zone 2 and the region 8 is blocked, the signal fed in at the terminal 40 in this case can only pass via the relatively small blocking layer capacitance (e.g., approximately 0.3pF) from the zone 2 to the zone 9. Since, however, the path between the zone 9 and the zone 3 is conductive, and since the zone 2 continues to be connected to ground via a capacitance 48, the input signal is practically completely shunted to ground. The attenuations which may be reached under these circumstances are above 40 dB, for example, for a frequency of 800 MHz, and increase further as the frequency is lowered.

In order to obtain intermediate attenuation values, the above mentioned control signals are continuously varied between the extreme values. This variation takes place automatically in receivers, the attenuation element being employed as the setting element of the control circuit.

The dimensions of the zones 2 and 3 need not be identical. In particular, the area of the control zone 3 can be larger, as a result of which the signal can be discharged to ground via a low resistance.

In the mode of operation of the attenuation element in accordance with the invention which has been described thus far, in the case of high attenuations, a mismatching to an input line (not shown) which is connected to the input terminal 40 can occur. It is in order to avoid mismatchings of this kind that, in the embodiment shown in FIGS. 2 and 3, the further zones 12 and 312 are provided. As already stated, these zones are highly doped in comparison with the region 8 of the semiconductor body 1.

The embodiment of FIG. 2 has been shown connected into the circuit of FIG. 4. However, it should be noted that when the embodiment of FIG. 3 is connected into the circuit of FIG. 4 instead, the same effect is achieved with respect to matching with the input line.

In the case of high attenuations relative to ground, a zero control voltage or a negative control voltage is applied to the terminal 44, a positive control voltage relative to ground is applied to the terminal 46, and a negative control voltage is applied to a terminal 42 which is connected to the terminal 14 of the attenuation element. The zone 12 is also connected to ground for high frequencies. A control current flowing through the input zone 2 with these potential distributions, therefore flows away via the zone 12 in the case of high attenuations. The control current flowing between the terminals 6 and 14 is now so selected that the differential resistance for the signal frequency between these terminals is approximately equal to the surge impedance of the signal line coupled to the input terminal 40. Reflections of the input signal are thus prevented.

If control current begins to flow between the input zone 2 and the zone 9 with a lower degree of attenuation, the control current between the zone 2 and the zone 12 is reduced to such an extent that the resultant input impedance of the attenuation element is substantially equal to the surge impedance of the input line. As the degree of attenuation is lowered, the control current between the input zone 2 and the zone 12 tends towards zero.

It should be noted that it is not absolutely required that the potentials applied to the terminals 42 and 46 possess the relative values described above for low attenuation and high attenuation. For example, in place of zero potentials and voltages, negative voltages can also be applied. What is important is simply that the potential differences which lead to the given current distributions at the various p-n junctions should be provided for the various given operational states with differing attenuations.

If the differential resistance between the input zone 2 and the zone 12 or, in the embodiment shown in FIG. 3, the zone 312, with the maximum control current flowing between these zones, is smaller than the surge impedance of an input signal line coupled to the input terminal 40, then, in accordance with a further feature of the invention illustrated in FIG. 5, a matching resistor 43 can be connected into the line leading from the terminal 42 to the terminal 14 and the zone 12.

The invention is not limited to the embodiments described above and shown in the drawing. For example, in a semiconductor body there can be provided a plurality of attenuation elements according to the invention which may be connected in series to increase the attenuation. It is also not absolutely necessary to provide the highly doped zones 9 and 39 in the attenuation element. In the embodiment shown in FIG. 1, the electrode 10 can be directly applied to the region 8 of the semiconductor body 1. Finally, the passive components which are included in the circuit shown in FIG. 4 can also be directly integrated into the semiconductor body 1.

Many other changes and modifications of the invention may become apparent to those skilled in the art without departing from the spirit and scope of the invention. It is therefore intended that all such changes and modifications be included within the patent warranted hereon as may reasonably and properly be included within the spirit and scope of my contribution to the art.

I claim:

1. An integrated attenuation element having a variable attenuation characteristic for high frequency signals, comprising: a semiconductor body of one conductivity type having opposite faces, two zones of the opposite conductivity type arranged in one face of said semiconductor body, a contact electrode carried on the face of said semiconductor body opposite to that containing said two zones, one of said zones operable as an input or output and said contact electrode operable as an output or input respectively for the high frequency signals, and control sources connected to said two zones.

2. An attenuation element as claimed in claim 1, wherein said zones of said other conductivity type are arranged in alignment in a row with respect to one another.

3. An attenuation element as claimed in claim 1, comprising a third zone of said one conductivity type formed in said opposite face of said semiconductor body, said semiconductor body and said third zone being doped and said third zone having a doping concentration which is high in comparison to that of said semiconductor body, said contact electrode contacting said third zone.

4. An attenuation element as claimed in claim 1, comprising an electrode on said semiconductor body adjacent to said zone which serves as said input zone.

5. An attenuation element as claimed in claim 4, wherein said electrode is in the form of a contact which directly contacts said semiconductor body.

6. An integrated attenuation element having a variable attenuation characteristic for high frequency signals, comprising: a semiconductor body of one conductivity type having opposite faces, two zones of the opposite conductivity type arranged in one face of said semiconductor body, a contact electrode carried on the face of said semiconductor body opposite to that containing said two zones, one of said zones operable as an input or output and said contact electrode operable as an output or input respectively for the high frequency signals, and the other of said zones operable as a control zone, and an electrode on said semiconductor body adjacent to said zone which serves as said input zone, said electrode including a further zone of said one conductivity type arranged in said semiconductor body adjacent to said input zone and a contact carried on said further zone.

7. An attenuation element as claimed in claim 6, wherein said further zone is provided in said opposite face of said semiconductor body.

8. An attenuation element as claimed in claim 6, wherein said further zone is provided in said one face of said semiconductor body.

9. An attenuation element as claimed in claim 8, wherein said zones of said other conductivity type and said further zone are arranged in alignment in a row with respect to one another.

10. A controllable attenuation circuit arrangement, comprising: an integrated attenuation element having a variable attenuation characteristic for high frequency signals including a semiconductor body of one conductivity type and having opposite faces, two zones of the opposite conductivity type arranged in one face of said semiconductor body, said semiconductor body having a contact electrode on the face opposite to that containing said two zones, one of said zones serving as an input or output and said contact electrode serving as an output or input respectively for high frequency signals, and the other of said zones serving as a control zone; means for applying a first control signal between said input zone and said contact electrode, means for decoupling high frequency signals at said input zone with respect to ground, the amplitude of said first signal being variable in such a manner that for minimal attenuation it possesses a value at which the p-n junction between said input zone and said semiconductor body is biased in the pass direction, and said input signal falls to a limit value at which the p-n junction does not conduct a current, to provide maximum attenuation; and means for applying a second control signal between said control zone and said contact electrode, said control zone connected to ground with respect to high frequencies, the amplitude of said second signal being variable in such a manner that for minimal attenuation it possesses a value at which the p-n junction between said control zone and said semiconductor body does not conduct a current and to produce increasing attenuation up to a maximum attenuation the amplitude is increased with a polarity such that the p-n junction continuously conducts current to an increasing extent.

11. A controllable attenuation circuit arrangement according to claim 10, wherein an electrode is provided on said semiconductor body adjacent to said input zone, and comprising means for providing a control signal between said electrode and said contact electrode, the amplitude of said control signal being variable so that in case of high degrees of attenuation it provides a potential difference between said input zone and said further zone at which the differential resistance between said input zone and said further zone is approximately equal to the surge impedance of an input line to be connected to said input zone.

12. A controllable attenuation circuit arrangement according to claim 10, comprising a matching resistor connected to said control signal means and said further zone.

* * * * *